(12) United States Patent
Huang et al.

(10) Patent No.: US 8,860,082 B2
(45) Date of Patent: Oct. 14, 2014

(54) TRANSIENT VOLTAGE SUPPRESSOR CIRCUIT, AND DIODE DEVICE THEREFOR AND MANUFACTURING METHOD THEREOF

(75) Inventors: Tsung-Yi Huang, Hsinchu (TW); Jin-Lian Su, Kaohsiung (TW)

(73) Assignee: Richtek Technology Corporation, R.O.C., Hsin-Chu (TW)

( * ) Notice: Subject to any disclaimer, the term of this patent is extended or adjusted under 35 U.S.C. 154(b) by 197 days.

(21) Appl. No.: 13/549,501

(22) Filed: Jul. 15, 2012

(65) Prior Publication Data

US 2014/0015008 A1  Jan. 16, 2014

(51) Int. Cl.
*H01L 29/74* (2006.01)
*H01L 31/111* (2006.01)

(52) U.S. Cl.
USPC ............................. 257/173; 257/355

(58) Field of Classification Search
CPC ................. H01L 27/0255; H01L 21/761
USPC ............................................. 257/173, 355
See application file for complete search history.

(56) References Cited

U.S. PATENT DOCUMENTS

2009/0115018 A1* 5/2009 Mallikarjunaswamy ..... 257/517

* cited by examiner

*Primary Examiner* — Thien F Tran
(74) *Attorney, Agent, or Firm* — Tung & Associates

(57) ABSTRACT

The present invention discloses a transient voltage suppressor (TVS) circuit, and a diode device therefor and a manufacturing method thereof. The TVS circuit is for coupling to a protected circuit to limit amplitude of a transient voltage which is inputted to the protected circuit. The TVS circuit includes a suppressor device and at least a diode device. The diode device is formed in a substrate, which includes: a well formed in the substrate; a separation region formed beneath the upper surface; a anode region and a cathode region, which are formed at two sides of the separation region beneath the upper surface respectively, wherein the anode region and the cathode region are separated by the separation region; and a buried layer, which is formed in the substrate below the well with a higher impurity density and a same conductive type as the well.

9 Claims, 4 Drawing Sheets

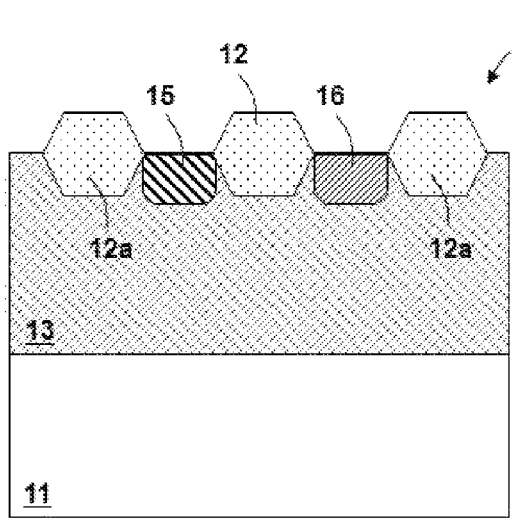
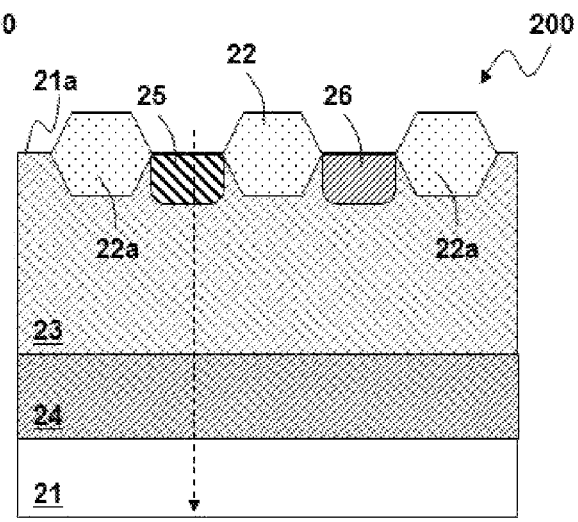
Fig. 3A (Prior Art)　　　　Fig. 4A
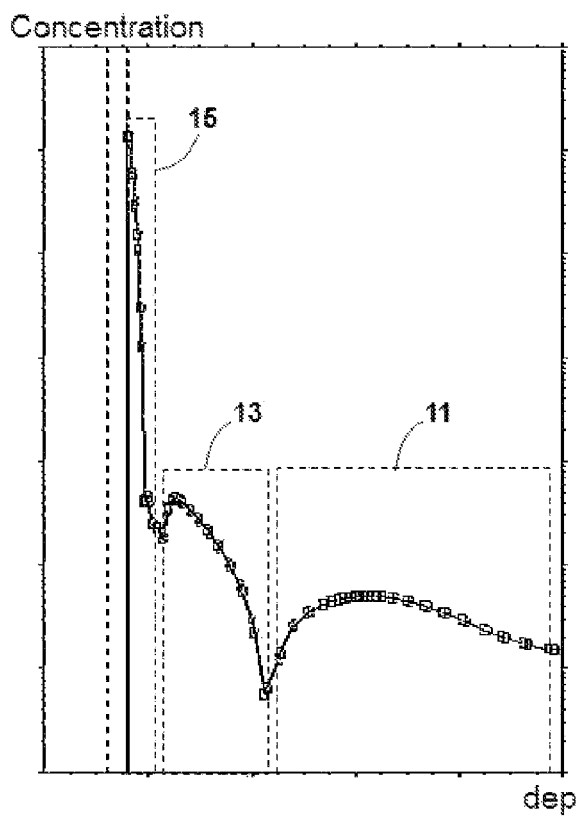
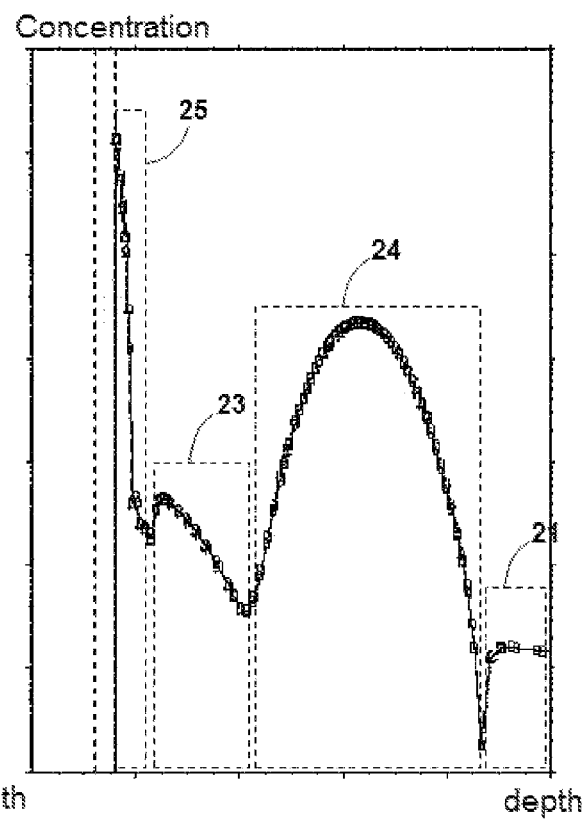
Fig. 3B (Prior Art)　　　　Fig. 4B

US 8,860,082 B2

TRANSIENT VOLTAGE SUPPRESSOR CIRCUIT, AND DIODE DEVICE THEREFOR AND MANUFACTURING METHOD THEREOF

BACKGROUND OF THE INVENTION

1. Field of Invention

The present invention relates to a transient voltage suppressor (TVS) circuit, and a diode device therefor and a manufacturing method thereof; particularly, it relates to such TVS circuit wherein a higher forward current can be sustained, and a diode device therefor and a manufacturing method thereof.

2. Description of Related Art

FIG. 1A shows a typical TVS circuit 1. The TVS circuit 1 is coupled to a protected circuit 2, for limiting amplitude of a transient voltage from an input/output (I/O) pad 3, so as to protect the protected circuit 2 from damages caused by the transient voltage (by static charges, for example). In general, the TVS circuit 1 includes a suppressor device S1 for clamping the amplitude of the transient voltage and for absorbing an excess current path. Because the suppressor device S1 needs to release a high current in a very short time, a large area PN junction is required, resulting in a very high parasitic capacitance. Therefore, during normal operation, the operation speed of the protected circuit 2 is lowered by the parasitic capacitance, and thus the application range of the protected circuit 2 is limited.

FIGS. 3A and 3B are a schematic cross-section diagram and a simulation curve showing a diode device 100 of the prior art TVS circuit 1 and its impurity concentration distribution, respectively. As shown in FIG. 3A, the prior art diode device 100 is formed in a substrate 11, and includes an N-type well 13, a field oxide region 12, isolation regions 12a, a P-type anode region 15 and an N-type cathode region 16. FIG. 3B is the simulation curve showing the impurity concentration from an upper surface of the P-type anode region 15 downward in the prior art diode device 100.

A method for increasing the operation speed of the protected circuit 2 is, as shown in FIG. 1A, providing at least one diode device D1 with a lower parasitic capacitance between the protected circuit 2 and the suppressor device S1. The PN junction of the diode device D1 and the PN junction of the suppressor device S1 are connected in reverse series, such that a current may flow through the diode device D1 in a forward direction, and the suppressor device S1 can absorb and release a high current once it occurs; i.e., by connecting a capacitor with low capacitance and a capacitor with high capacitance in series, the total capacitance is reduced to increase the operation speed of the protected circuit 2. However, though this method can suppress the problem of the high capacitance of the suppressor device S1, the diode devices D1 still need to sustain the high current induced by the transient voltage from the I/O pad 3. And if the TVS circuit 1 has a lower capacitance, the current which the TVS circuit can sustain is reduced, and thus the application range of the TVS circuit 1 is limited.

In view of above, to overcome the drawbacks in the prior art, the present invention proposes a TVS circuit, and a diode device therefor and manufacturing method thereof so that the TVS circuit may sustain a higher forward current, and the protected circuit may have a broader application range.

TOTAL OF THE INVENTION

A first objective of the present invention is to provide a transient voltage suppressor (TVS) circuit.

A second objective of the present invention is to provide a diode device for a TVS circuit.

A third objective of the present invention is to provide a manufacturing method of a TVS circuit.

To achieve the objectives mentioned above, from one perspective, the present invention provides a transient voltage suppressor (TVS) circuit for coupling to a protected circuit to limit amplitude of a transient voltage which is inputted to the protected circuit, the TVS circuit comprising: a suppressor device, which has a PN junction for limiting amplitude of the transient voltage; and at least one diode device, which is coupled between the protected circuit and the suppressor device, wherein the diode device has a PN junction which is coupled to the PN junction of the suppressor device in a reverse direction; wherein the diode device is formed in a first conductive type substrate, which has an upper surface, the diode device including: a well having the first conductive type or a second conductive type, which is formed in the substrate beneath the upper surface; a separation region, which is formed in the substrate beneath the upper surface, wherein the separation region is located in the well from top view; a first conductive type anode region, which is formed beneath the upper surface at one side of the separation region; a second conductive type cathode region, which is formed beneath the upper surface at the other side of the separation region, wherein the cathode region is separated from the anode region by the separation region; and a buried layer, which is formed in the substrate below the well, wherein the buried layer has a same conductive type with the well, and its impurity concentration is higher than that of the well.

From another perspective, the present invention provides a diode device for a transient voltage suppressor (TVS) circuit, the TVS circuit including a suppressor device having a PN junction, wherein the diode device has a PN junction which is coupled to the PN junction of the suppressor device in a reverse direction, and the diode device is formed in a first conductive type substrate which has an upper surface, the diode device comprising: a well having the first conductive type or a second conductive type, which is formed in the substrate beneath the upper surface; a separation region, which is formed in the substrate beneath the upper surface, wherein the separation region is located in the well from top view; a first conductive type anode region, which is formed beneath the upper surface at one side of the separation region; a second conductive type cathode region, which is formed beneath the upper surface at the other side of the separation region, wherein the cathode region is separated from the anode region by the separation region; and a buried layer, which is formed in the substrate below the well, wherein the buried layer has a same conductive type with the well, and its impurity concentration is higher than that of the well.

From another perspective, the present invention provides a manufacturing method of a diode device for a transient voltage suppressor (TVS) circuit, wherein the TVS circuit includes a suppressor device having a PN junction, and the diode device has a PN junction which is coupled to the PN junction of the suppressor device in a reverse direction, the manufacturing method comprising: providing a first conductive type substrate, which has an upper surface; forming a well having the first conductive type or a second conductive type in the substrate beneath the upper surface, and forming a buried layer in the substrate below the well, wherein the buried layer has a same conductive type with the well, and its impurity concentration is higher than that of the well; forming a separation region in the substrate beneath the upper surface, wherein the separation region is located in the well from top view; forming a first conductive type anode region beneath the upper surface at one side of the separation region; and forming a second conductive type cathode region beneath the upper surface at the other side of the separation region, wherein the cathode region is separated from the anode region by the separation region.

The suppressor device may include: a varistor device, a Zener diode, two Zener diodes connected in reverse series, or a gate-less metal oxide semiconductor (MOS) device.

In one embodiment, the separation region includes a field oxide region or an intrinsic semiconductor region.

In another embodiment, the TVS circuit includes a plurality of the diode devices which are arranged at both sides of the suppressor device.

In another embodiment, the buried layer and the well are defined in a same region from top view.

The objectives, technical details, features, and effects of the present invention will be better understood with regard to the detailed description of the embodiments below.

BRIEF DESCRIPTION OF THE DRAWINGS

FIGS. 3A-3B show a cross-section view and a simulated impurity concentration distribution of a diode device 100 in a prior art TVS circuit, respectively.

FIGS. 4A and 4B show a first embodiment of the present invention.

DESCRIPTION OF THE PREFERRED EMBODIMENTS

Figure 1A:
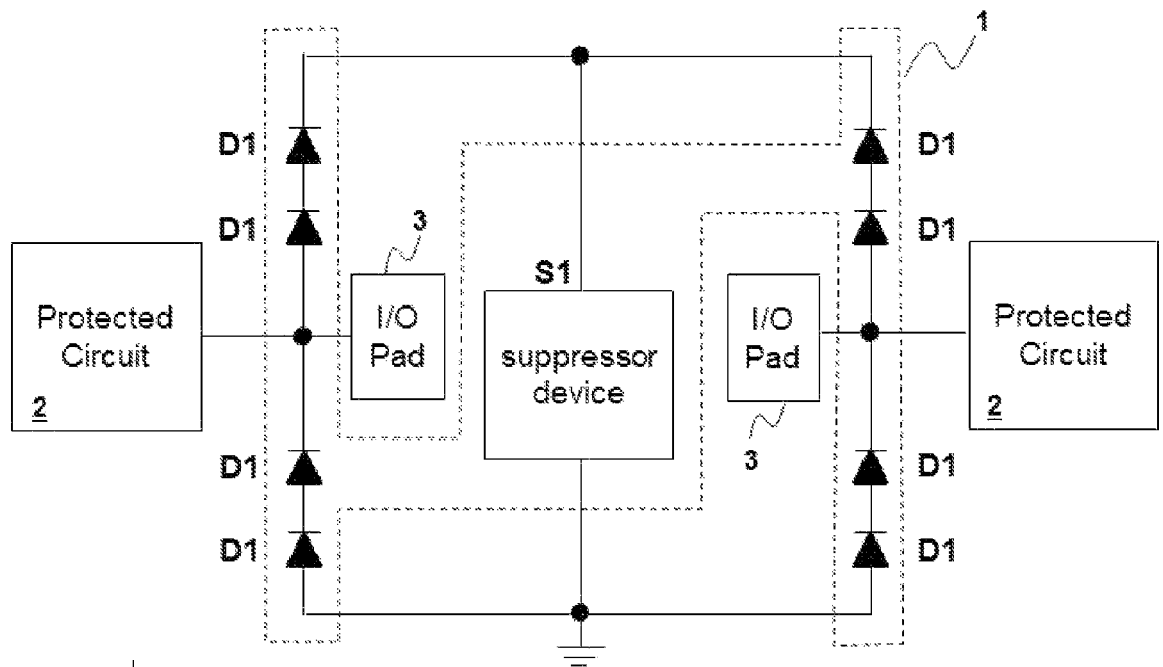
FIG. 1A shows a typical transient voltage suppressor (TVS) circuit 1.

The drawings as referred to throughout the description of the present invention are for illustration only, to show the interrelations between the regions and the process steps, but not drawn according to actual scale.

Please refer to FIGS. 4A and 4B for a first embodiment according to the present invention, wherein FIG. 4A is a cross-section schematic diagram showing a diode device 200 for a transient voltage suppressor (TVS) circuit according to the present invention. As shown in FIG. 4A, the diode device 200 is formed in a substrate 21 which has an upper surface 21a, wherein the substrate 21 is for example but not limited to a P-type substrate (or an N-type substrate in another embodiment). Next, for example but not limited to an N-type well 23 is formed beneath the upper surface 21a in the substrate 21, and a buried layer 24 is formed beneath the well 23 in the substrate 21. The buried layer 24 has a same conductive type with the well 23 (N-type in this embodiment), and the impurity concentration of the buried layer 24 is higher than that of the well 23. The sequence order of the ion implantation process steps for the buried layer 24 and the well 23 may be interchanged. Then, a field oxide region 22 and isolation regions 22a are formed on the upper surface 21a of the substrate 21. The field oxide region 22 is located in the well 23 from top view (not show). The field oxide region 22 and the isolation region 22a for example are a local oxidation of silicon (LOCOS) structure or a shallow trench isolation (STI) structure, the former being shown in the figure. Next, a P-type anode region 25 and an N-type cathode region 26 are formed beneath the upper surface 21a at two sides of the field oxide region 22 respectively, wherein the cathode region 26 is separated from the anode region 25 by the field oxide region 22.

Referring to FIG. 4B shows a simulated impurity concentration distribution curve along a dash arrow line shown in FIG. 4A of the first embodiment. In FIG. 4B, the vertical axis indicates the impurity concentration, and the horizontal axis indicates a depth from the upper surface 21a. The impurity concentration distribution curve shown in FIG. 4B indicates the relationship between the depth and the impurity distribution of the P-type anode region 25, the N-type well 23, the N-type buried layer 24, and the P-type substrate 21. Comparing the impurity concentration distribution curves of the prior art and the present invention shown in FIGS. 3B and 4B, the buried layer 24 which is formed beneath the well 23 in this embodiment is an additional layer to the prior art. This arrangement is advantageous in that: First, the diode device in the TVS circuit of the present invention can sustain a relatively higher transient forward current due to the additional buried layer with higher impurity concentration, and thus the application range of the TVS circuit is broadened. Second, in manufacturing process, no additional mask is required, that is, the well 23 and the buried layer 24 may be formed without any additional mask, requiring only one additional implantation process step which forms the buried layer 24. As such, the TVS circuit according to the present invention can be manufactured by a low cost.

More specifically, when the protected circuit operates in a normal operation condition, i.e., when the whole circuitry operates with a relatively lower voltage and current, the operation speed of the protected circuit is primarily related to a relatively lower capacitance formed by the P-type anode region 25 and the N-type well 23 in the diode device 200, which is comparable to the capacitance of the prior art diode device 100. On the other hand, when a transient signal (such as an electrostatic signal) with a high voltage and current is applied to the circuitry, the transient signal can be released through the diode device 200 with a higher capacitance which is formed by the P-type anode region 25 and the N-type buried layer 24 because of the higher N-type impurity concentration of the buried layer 24, such that the diode device 200 can sustain a higher forward current compared to the prior art diode device 100. In summary, when the protected circuit is coupled to the TVS circuit of the present invention, the operation speed is faster or at least comparable to the prior art in the normal operation condition, and the circuitry can sustain a higher current once a transient signal (such as an electrostatic signal) with a high voltage and current is applied to the circuitry, because the TVS circuit of the present invention has a higher transient capacitance. The higher transient capacitance of the TVS circuit according to the present invention can sustain and release a higher current, such that the protected circuit can sustain a higher transient voltage and current, to enhance its ability against the ESD (Electro-Static discharge).

Figure 5:
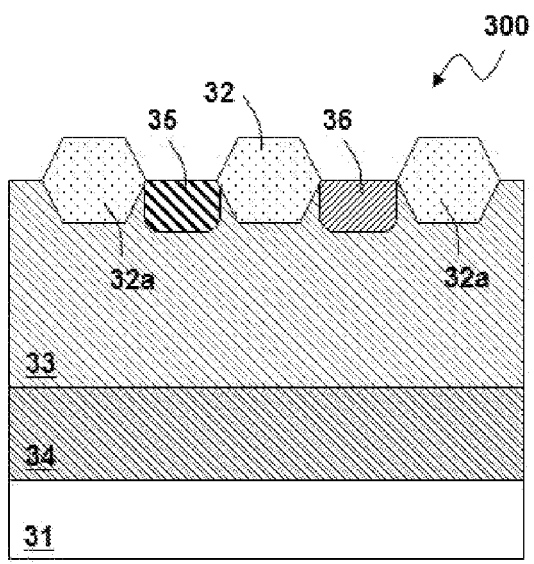
FIG. 5 shows a second embodiment of the present invention.

FIG. 5 is a schematic diagram showing a cross-section view of a diode device 300 in the TVS circuit of the present invention, which is a second embodiment of the present invention different from the first embodiment. As shown in the figure, the diode device 300 is formed in a substrate 31, and includes a field oxide region 32, isolation region 32a, a P-type well 33, a P-type buried layer 34, a P-type anode region 35, and an N-type cathode region 36. This embodiment indicates that, the diode device according to the present invention may include the N-type well and buried layer (such as the first embodiment), or the P-type well and buried layer (such as the second embodiment). Note that in both embodiments the conductive type of the well and the buried layer is the same, and the impurity concentration in the buried layer is higher than that in the well.

Figure 6:
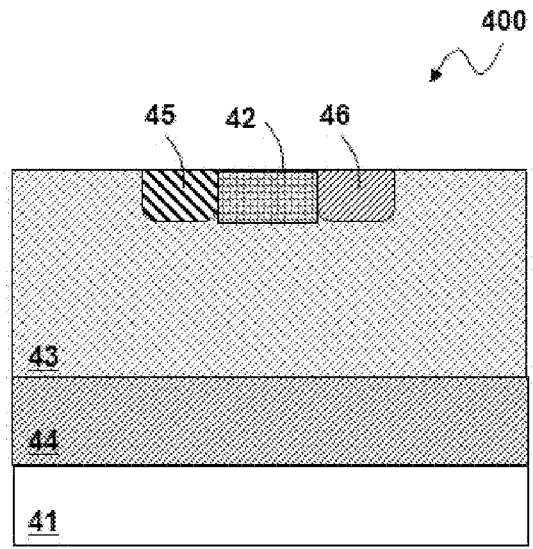
FIG. 6 shows a third embodiment of the present invention.

FIG. 6 is a schematic diagram showing a cross-section view of a diode device 400 in the TVS circuit of the present invention, which is a third embodiment of the present invention different from the first embodiment. As shown in the figure, the diode device 400 is formed in a substrate 41, and includes an intrinsic semiconductor region 42, an N-type well 43, an N-type buried layer 44, a P-type anode region 45, and an N-type cathode region 46. This embodiment indicates that, in the diode device according to the present invention, an intrinsic semiconductor region may be used to separate the anode region and the cathode region instead of the field oxide region. The intrinsic semiconductor region is a semiconductor region without or with a low impurity concentration.

Figure 1B:
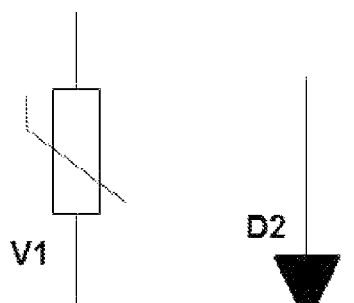
FIGS. 1B-1D show several embodiments of the suppressor device of the TVS circuit according to the present invention.
Figure 1D:
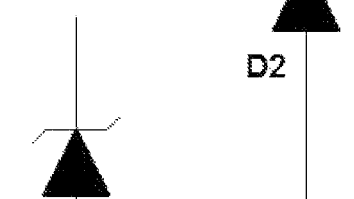
Figure 1C:
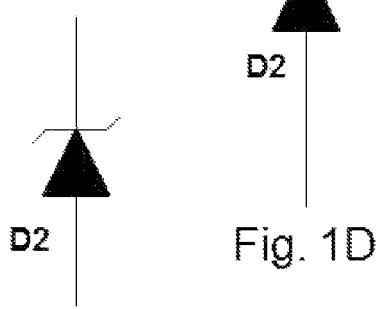

FIGS. 1B-1D and 2 show several embodiments of the suppressor device in the TVS circuit according to the present invention. As shown in FIGS. 1B-1D and 2, the suppressor device is for example but not limited to a varistor device V1 as shown in FIG. 1B, a Zener diode D2 as shown in FIG. 1C, two Zener diodes D2 connected in reverse series, or a gate-less metal oxide semiconductor (MOS) device Q1.

Figure 2:
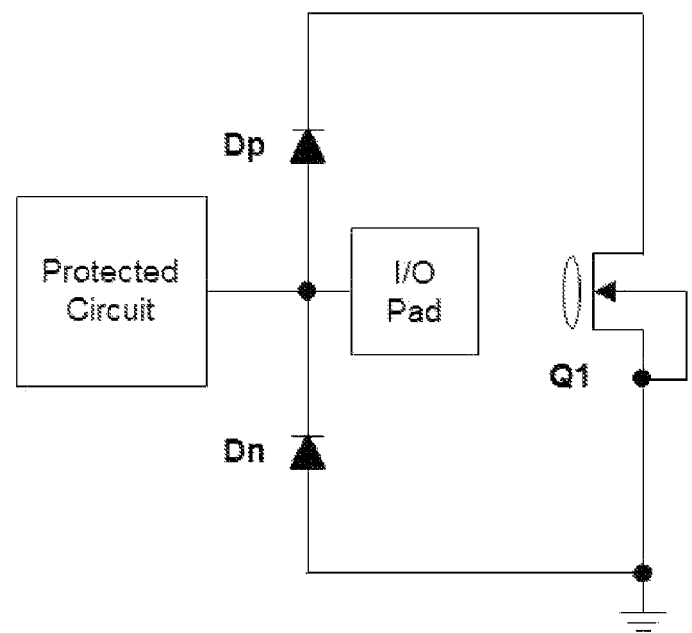
FIG. 2 shows a preferable arrangement of the diode devices in the TVS circuit according to the present invention.

FIG. 2 also shows a preferable arrangement of the TVS circuit according to the present invention. As shown in FIG. 2, multiple diode devices Dp and Dn are arranged at both sides of the suppressor device (in this embodiment, the MOS device Q1), wherein the diode device Dp includes for example but not limited to N-type well and N-type buried layer, and the diode device Dn includes for example but not limited to P-type well and P-type buried layer.

Figure 7:
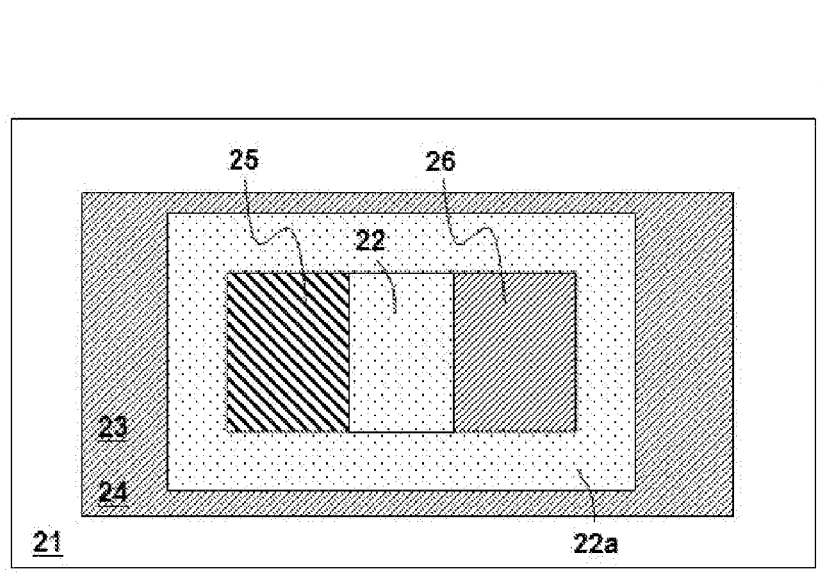
FIG. 7 shows a schematic top view of a diode device 200 of the first embodiment.

FIG. 7 is a schematic diagram showing a top view of the diode device 200 in the first embodiment of the present invention. As shown in the top view of FIG. 7, the buried layer 24 and the well 23 of the diode device 200 are defined in a same region, i.e., they are overlapped; thus, they may be defined by a same lithography process step. In this manner, the TVS circuit according to the present invention can better sustain a transient signal having a high voltage and current, but almost without increasing the manufacturing cost.

Figure 8:
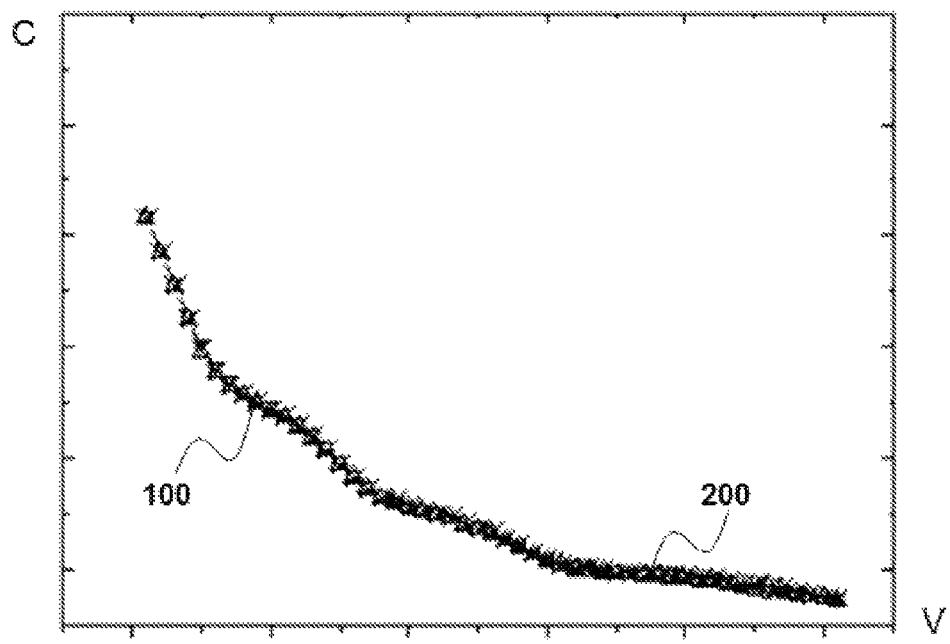
FIG. 8 shows characteristic curves of TVS circuits 100 and 200 of the prior art and the present invention, respectively.

FIG. 8 shows characteristic curves of the capacitance versus the voltage in the TVS circuits 100 and 200 of the prior art and the present invention, respectively. As shown in the figure, the two characteristic curves are substantially overlapped, which indicates that, when the protected circuit operates in the normal condition, the capacitances of the TVS circuits 100 and 200 are about the same. The reason has been explained in the above description. FIG. 8 indicates that the additional buried layer of the present invention does not impact the capacitance of the circuitry in a normal operation, and thus the operation speed of the protected device is not impacted.

Figure 9:
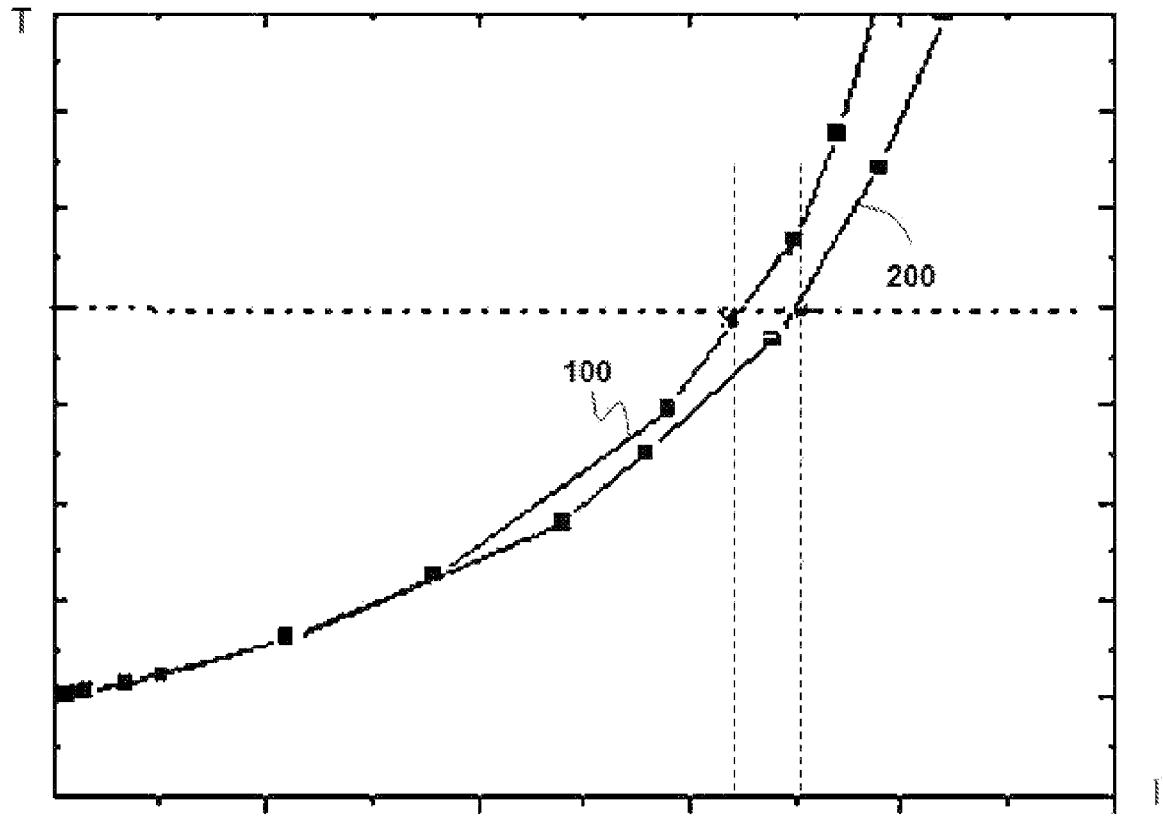
FIG. 9 shows temperature versus current characteristic curves of the TVS circuits 100 and 200 of the prior art and the present invention respectively, in an electrostatic discharge (ESD) test.

FIG. 9 shows temperature versus current characteristic curves of the TVS circuits 100 and 200 of the prior art and the present invention respectively, in an ESD test. In a predetermined temperature range, the maximum transient currents of the transient signal which the TVS circuits 100 and 200 can sustain are indicated by the characteristic curves shown in FIG. 9. According to the figure, the TVS circuit 200 of the present invention can sustain a higher forward current compared to the prior art TVS circuit 100. In summary, referring to FIGS. 8 and 9, the TVS circuit according to the present invention can sustain a higher transient current without impacting the operation speed in the normal operation condition; or, from another perspective, the present invention can enhance the operation speed of the protected circuit in the normal operation condition with the same maximum transient current as the prior art.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a deep well, etc., can be added. For another example, the order of the process steps for manufacturing the diode device may be interchanged; for example, the well and the buried layer can be formed before or after the field oxide region. For yet another example, it is described that the well and the buried layer may be defined by a same mask, but in another embodiment, they may be formed by blanket implantation without any mask. In view of the foregoing, the spirit of the present invention should cover all such and other modifications and variations, which should be interpreted to fall within the scope of the following claims and their equivalents.

What is claimed is:

1. A transient voltage suppressor (TVS) circuit for coupling to a protected circuit to limit amplitude of a transient voltage which is inputted to the protected circuit, the TVS circuit comprising:
   a suppressor device, which has a PN junction for limiting amplitude of the transient voltage; and
   at least one diode device, which is coupled between the protected circuit and the suppressor device, wherein the diode device has a PN junction which is coupled to the PN junction of the suppressor device in a reverse direction;
   wherein the diode device is formed in a P-type substrate, which has an upper surface, the diode device including:
      an N-type well, which is formed in the substrate beneath the upper surface;
      a separation region, which is formed in the substrate beneath the upper surface, wherein the separation region is located in the well from top view;
      a P-type anode region, which is formed beneath the upper surface at one side of the separation region;
      an N-type cathode region, which is formed beneath the upper surface at the other side of the separation region, wherein the cathode region is separated from the anode region by the separation region; and
      an N-type buried layer, which is formed in the substrate below the well, wherein the buried layer has an impurity concentration higher than that of the well.

2. The TVS circuit of claim 1, wherein the separation region includes a field oxide region or an intrinsic semiconductor region.

3. The TVS circuit of claim 1, wherein the suppressor device includes: a varistor device, a Zener diode, two Zener diodes connected in reverse series, or a gate-less metal oxide semiconductor (MOS) device.

4. The TVS circuit of claim 1, wherein the TVS circuit includes a plurality of the diode devices which are arranged at both sides of the suppressor device.

5. The TVS circuit of claim 1, wherein the buried layer and the well are defined in a same region from top view.

6. A diode device for a transient voltage suppressor (TVS) circuit, the TVS circuit including a suppressor device having a PN junction, wherein the diode device has a PN junction which is coupled to the PN junction of the suppressor device in a reverse direction, and the diode device is formed in a P-type substrate which has an upper surface, the diode device comprising:
- an N-type well, which is formed in the substrate beneath the upper surface;
- a separation region, which is formed in the substrate beneath the upper surface, wherein the separation region is located in the well from top view;
- a P-type anode region, which is formed beneath the upper surface at one side of the separation region;
- an N-type cathode region, which is formed beneath the upper surface at the other side of the separation region, wherein the cathode region is separated from the anode region by the separation region; and
- an N-type buried layer, which is formed in the substrate below the well, wherein the buried layer has an impurity concentration higher than that of the well.

7. The diode device of claim 6, wherein the separation region includes a field oxide region or an intrinsic semiconductor region.

8. The diode device of claim 6, wherein the suppressor device includes a varistor device, a Zener diode, two Zener diodes connected in reverse series, or a gate-less metal oxide semiconductor (MOS) device.

9. The diode device of claim 6, wherein the buried layer and the well are defined in a same region from top view.

* * * * *